(12) United States Patent (10) Patent No.: US 7,705,637 B2
Ladurner et al. (45) Date of Patent: Apr. 27, 2010

(54) SEMICONDUCTOR SWITCH AND METHOD FOR OPERATING A SEMICONDUCTOR SWITCH

(75) Inventors: Markus Ladurner, Villach (AT); Robert Illing, Villach (AT)

(73) Assignee: Infineon Technologies AG, Neubiberg (DE)

( * ) Notice: Subject to any disclaimer, the term of this patent is extended or adjusted under 35 U.S.C. 154(b) by 15 days.

(21) Appl. No.: 12/240,636

(22) Filed: Sep. 29, 2008

(65) Prior Publication Data

US 2010/0079193 A1 Apr. 1, 2010

(51) Int. Cl.
*H03K 3/00* (2006.01)
(52) U.S. Cl. ...................................... 327/108; 327/513
(58) Field of Classification Search ................ 327/108, 327/512, 513
See application file for complete search history.

(56) References Cited

U.S. PATENT DOCUMENTS

| | | | | |
|---|---|---|---|---|
| 5,737,169 | A * | 4/1998 | Sellers | 361/98 |
| 6,137,165 | A | 10/2000 | Thierry | |
| 6,281,738 | B1 * | 8/2001 | Kamiya | 327/513 |
| 6,300,146 | B1 * | 10/2001 | Thierry | 438/14 |
| 6,348,820 | B1 * | 2/2002 | Bennett et al. | 327/110 |
| 6,538,480 | B2 * | 3/2003 | Takada et al. | 327/108 |

FOREIGN PATENT DOCUMENTS

| | | |
|---|---|---|
| DE | 691 28 592 T2 | 6/1998 |
| DE | 100 31 115 A1 | 1/2001 |

OTHER PUBLICATIONS

Glavanovics, M., et al., "Dynamic Hot Spot Temperature Sensing in Smart Power Switches," ESSCIRC, 2002, pp. 295-298.

* cited by examiner

*Primary Examiner*—Kenneth B. Wells
(74) *Attorney, Agent, or Firm*—Slater & Matsil, L.L.P.

(57) ABSTRACT

A semiconductor switch, is provided that comprises a semiconductor element having a control terminal and two load terminals forming switching contacts of the semiconductor switch, a temperature measuring device for measuring the temperatures of the semiconductor element at two measurement locations spaced apart from one another, and also a control circuit connected between the temperature measuring device and the control terminal of the semiconductor element and having a control input forming the control contact of the semiconductor element, wherein provision is made for: measuring the temperatures of the semiconductor element at two measurement locations spaced apart from one another; providing a signal representing the difference between the two temperatures; driving a driving current of specific intensity into the control terminal of the semiconductor element if a corresponding signal is present at the control input in order to control the semiconductor element in the conducting state between its load terminals; increasing the intensity of the driving current if the semiconductor element is controlled in the conducting state and the temperature difference exceeds a first limit value.

20 Claims, 5 Drawing Sheets

SEMICONDUCTOR SWITCH AND METHOD FOR OPERATING A SEMICONDUCTOR SWITCH

TECHNICAL FIELD

The invention relates to a semiconductor switch, and to a method for operating a semiconductor switch.

BACKGROUND

Particularly in motor vehicles, but also in other areas, mechanical relays are increasingly being replaced by semiconductor switches such as, for example, transistors. This involves the application primarily of semiconductor switches that are additionally equipped with a logic that makes it possible to diagnose undesirable operating states such as, for example, short circuit, overload, overtemperature and/or open-load. One conventional application of such "intelligent" electronic switches is, e.g., modules for automobile lighting systems, wherein, for example, incandescent and similar lamps represent a problematic load for electronic switches.

In order firstly to minimize the losses in the conducting state of the electronic switches and secondly to prevent the area of the transistor from increasing significantly, the area-specific resistances of the transistors are minimized. At the present time they are for example already at values of between 150 mohm·mm$^2$ to 75 mohm·mm$^2$ at 150°. On account of the PTC (positive temperature coefficient) behavior of the incandescent lamps, high switch-on currents initially occur since the incandescent lamp resistance is initially low and only increases as the operating duration increases. The high switch-on currents in conjunction with the low area-specific on resistances bring about high power loss densities and, as a result, large temperature swings in the transistor.

Modern electronic switches generally have a short-circuit protection that causes the lamp to be switched off at excessively high currents. Particularly in the case of short-circuit concepts with temperature measurement, but also in the case of such concepts with current measurement, during the lamp switch-on process in a short time it is then possible for the switch-off to occur again owing to relatively large temperature swings on account of the large switch-on currents of the lamps. The switched-off state persists until the switch has cooled down again sufficiently. A renewed switch-on is thereupon effected with subsequent temperature-dictated (or current-dictated) switch-off. Consequently, the lamp is continuously switched on and off, such that it cannot be permanently switched on and hence cannot be operated properly. Consequently, the maximum switchable loads are reduced.

One procedure that has been practiced heretofore for avoiding this so-called "switch-on cycling" is based on the fact that the switching power loss can be decreased by increasing the switching speed. However, this concept is disadvantageous in practice in particular with regard to the electromagnetic emission and the associated EMC problem (EMC=electromagnetic compatibility).

SUMMARY

Various aspects of the present invention improve the switch-on behavior of semiconductor switches, particularly in the case of loads with a high switch-on current.

In a first embodiment, a novel semiconductor switch includes a semiconductor element, which has a control terminal and two load terminals that form switching contacts of the semiconductor switch. Furthermore, a temperature measuring device is provided, which measures the temperature of the semiconductor element and provides a signal representing the temperature. Finally, a control circuit is connected between the temperature measuring device and the control terminal of the semiconductor element. The control circuit has a control input forming the control contact of the semiconductor switch and, in the event of a corresponding signal at the control input, drives a driving current of specific intensity into the control terminal of the semiconductor element in order to control the semiconductor element in the conducting state between its load terminals. The control circuit increases the intensity of the driving current in the case where the semiconductor element is controlled in the conducting state and the temperature exceeds a first limit value.

A method for operating a semiconductor switch having a semiconductor element is also disclosed. The semiconductor element has a control terminal and two load terminals forming switching contacts of the semiconductor switch, a temperature measuring device for measuring the temperature of the semiconductor element, and also a control circuit connected between the temperature measuring device and the control terminal of the semiconductor element and having a control input forming the control contact of the semiconductor element. The temperature of the semiconductor element is measured and a signal representing the temperature is provided. A driving current of specific intensity is driven into the control terminal of the semiconductor element if a corresponding signal is present at the control input in order to control the semiconductor element in the conducting state between its load terminals. The intensity of the driving current is increased if the semiconductor element is controlled in the conducting state and the temperature exceeds a first limit value.

BRIEF DESCRIPTION OF THE DRAWINGS

The invention is explained in more detail below on the basis of the exemplary embodiments illustrated in figures of the drawing, wherein identical elements are provided with identical reference symbols.

DETAILED DESCRIPTION OF ILLUSTRATIVE EMBODIMENTS

Figure 1:
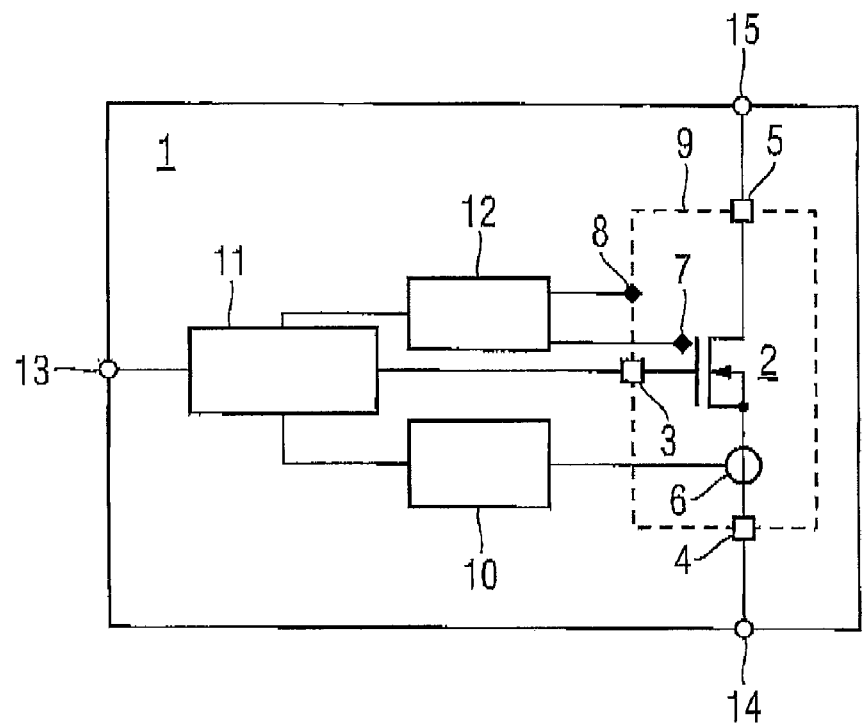
FIG. 1 is a block diagram of a general embodiment of a semiconductor switch according to the invention.

In accordance with FIG. 1, a semiconductor switch 1 according to a first embodiment of the invention includes a semiconductor element 2, which can be a DMOS field effect transistor, for example, as shown in FIG. 1. Alternatively, the switch can be by any desired field effect transistor, such as a bipolar transistor, an insulated gate bipolar transistor (IGBT) or some other controllable semiconductor element. The semiconductor element 2 has a control terminal 3, which in the illustrated case is formed by the gate terminal of the DMOS field effect transistor. Furthermore, the semiconductor element 2 has two load terminals 4 and 5, which in the illustrated case are formed by the drain and source terminals of the DMOS field effect transistor.

The semiconductor element 2 furthermore has at least one current or temperature sensor in order to detect an overload state of the semiconductor element 2. In the illustrated case, three sensors are provided. A sensor 6 is provided for the detection of the current flowing between the load terminals 4 and 5 and two sensors 7 and 8 are provided for the detection of the temperature of the semiconductor element 2. The two temperature sensors 7 and 8 are arranged in a manner spaced apart from one another. For example, these may be spaced in such a way that the sensor 7 is mounted near the active area of the semiconductor element 2 and the sensor 8 is mounted at the edge 9 of the semiconductor element 2 but is concomitantly integrated into the latter. (Such an arrangement forms the basis for the measurements in accordance with FIGS. 4 to 6).

However, other spaced-apart arrangements with suitable location-dependent temperature gradients can be employed in the same way, such as, for example, those in which the second sensor 8 is arranged on a leadframe or other chip (chip on chip; chip by chip).

In this case, a signal generated by the current sensor 6 is fed to an evaluation circuit 10, which compares the measured load current with a limit value and, in the case where the limit value is exceeded, feeds a time-delayed signal to a control circuit 11. In the case where an excessively high load current occurs with the semiconductor element 2 in the conducting state, immediately or after a certain dead time (for example, in the millisecond range), in response to the control circuit 11 coupled to the control terminal 3 of the semiconductor element 2, the semiconductor element 2 is controlled into a less conducting state (current limiting) as in the exemplary embodiment according to FIG. 1 or into the non-conducting state (switching-off) as in the exemplary embodiment according to FIG. 3.

The two temperature sensors 7 and 8 are coupled to an evaluation circuit 12, which determines the difference between the temperatures measured using the sensors 7 and 8 and compares this temperature difference with a limit value. If this limit value is exceeded, that is to say that if, in the present case, the temperature at the sensor 7 is higher than at the sensor 8 by a specific value, then the evaluation circuit 12 signals this to the control circuit 11, which thereupon increases the driver current flowing into the control terminal 3 and thus into the gate terminal of the semiconductor element 2 to a multiple of the driver current normally generated.

Figure 2:
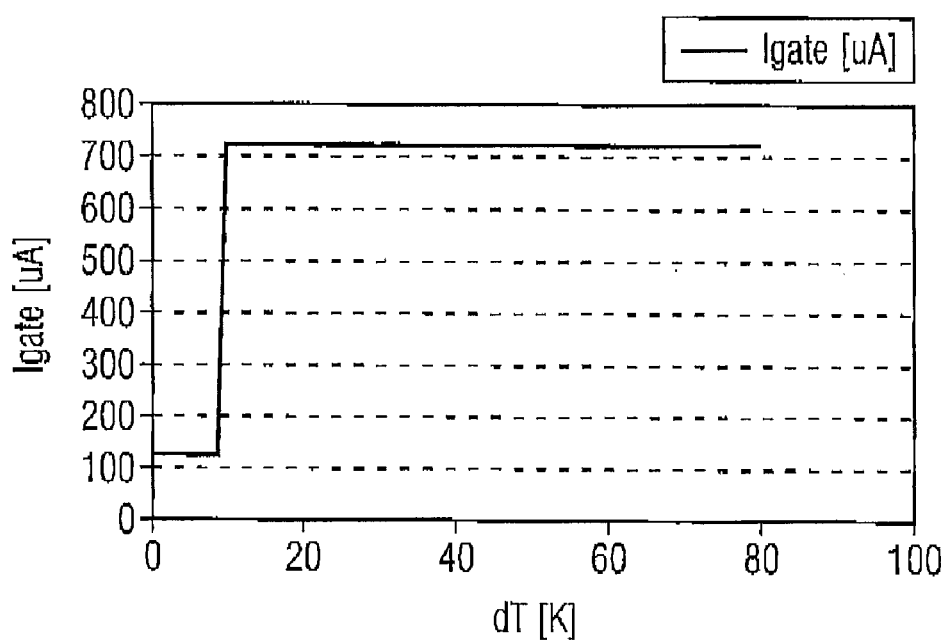
FIG. 2 is a diagram showing the profile of the control current after the switch-on against a measured temperature difference.

FIG. 2 illustrates how, in the semiconductor switch according to FIG. 1, the control current, that is to say the gate current Igate, behaves after a signal for turn-on (switching into the conducting state) occurs at a control contact 13 of the semiconductor switch 1. A conductive connection is produced between the load terminals 4 and 5 of the semiconductor element 2. The load terminals 4 and 5 form load contacts of the semiconductor switch 1. As can be seen from FIG. 2, the gate current Igate is initially somewhat more than 100 µA, which leads to the turn-on of the semiconductor element 2. The load current flowing in this case leads to a heating of the semiconductor element 2, to be precise in such a way that due to the thermal resistance occurring between the sensors 7 and 8, the sensor 7 is heated more rapidly than the sensor 8. As a result, the temperature difference between the two sensors increases and, in the case where the corresponding limit value for the temperature difference is exceeded, the gate current Igate is then increased, for example, to approximately sevenfold. Although the increase can be arbitrary, a value of between five and ten times the value of the normal driver current has proved to be favorable.

Figure 3:
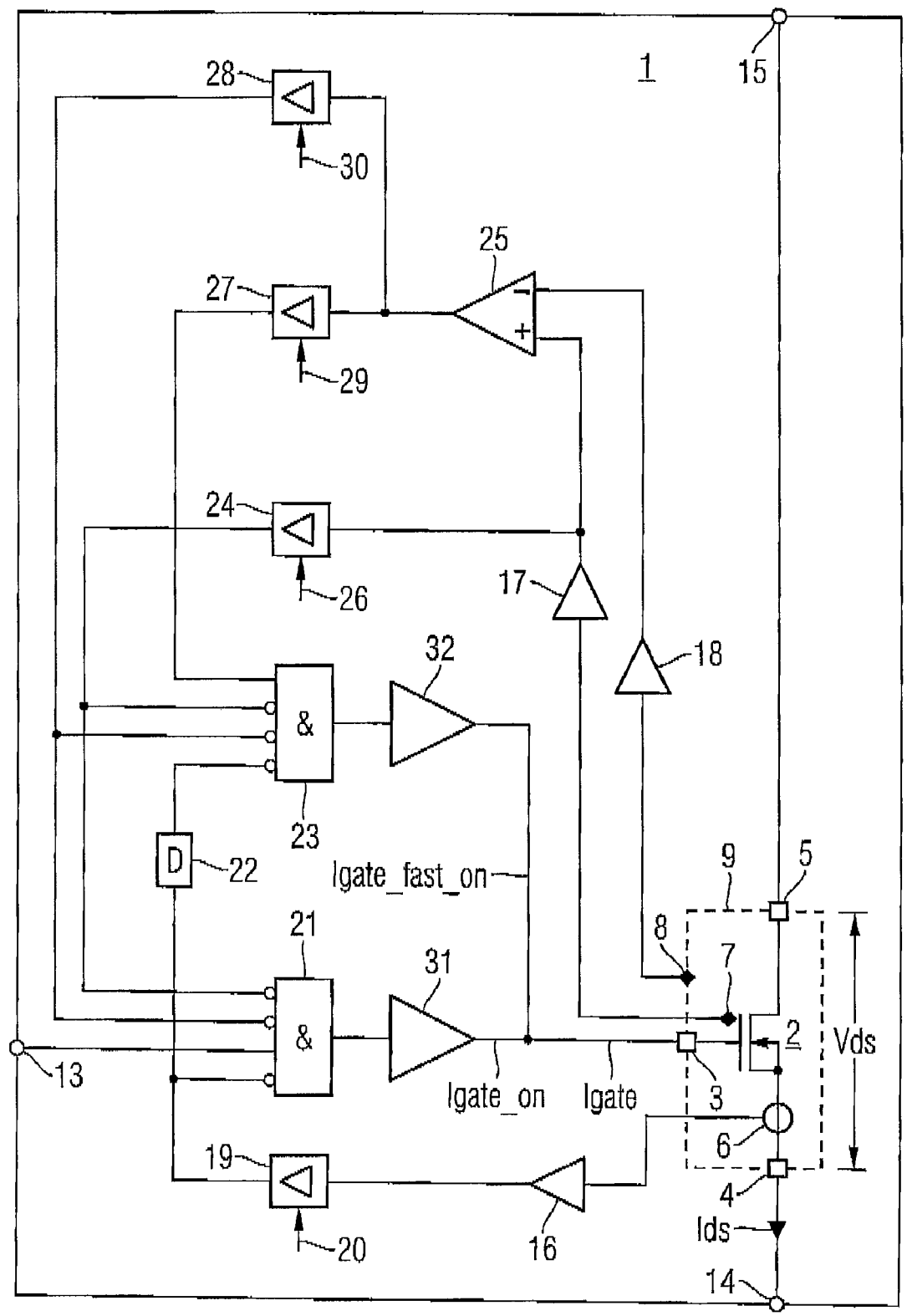
FIG. 3 is a detailed circuit diagram of a further embodiment of a semiconductor switch according to the invention.

FIG. 3 shows another embodiment of a semiconductor switch 1 according to another embodiment of the invention. In this case, the semiconductor element 2, in conjunction with the sensors 6, 7 and 8, is used in turn as in the embodiment according to FIG. 1. In this case, an amplifier 16 is connected downstream of the current sensor 6. The amplifier 16 amplifies and conditions the signal received from the current sensor 6 and forwards it to a comparator 19, which in turn compares the conditioned signal originating from the sensor 6 with a limit value 20. In the case where this limit value 20 is exceeded, that is to say starting from a certain load current intensity, the comparator outputs a signal, which in the present case is formed by a change from the logic state "0" to the logic state "1". This signal is fed to an AND gate 21 directly but in inverted fashion, and also to an AND gate 23 in inverted fashion and in a manner time-delayed by a delay element 22.

The signal generated by the temperature sensor 7 is conditioned by an amplifier 17 and fed both to a comparator 24 and to a subtractor 25. The comparator 24 compares the signal from the amplifier 17 with a limit value 26 and, in the case of signals above the limit value 26, generates a logic "1", which is applied in inverted fashion both to the AND gate 21 and to the AND gate 23. Similarly, the signal from the temperature sensor 8 amplified and conditioned by an amplifier 18 is applied to the subtractor 25, which in this case subtracts the signal from the sensor 8 from the signal from the sensor 7 and feeds the difference both to a comparator 27 and to a comparator 28. In this case, the two comparators 27 and 28 supply a logic "1" when an associated limit value 29 and 30, respectively, is exceeded. In this case, the limit value 30 is greater than the limit value 29.

The output of the comparator 27 is connected to an input of the AND gate 23. The output of the comparator 28 is applied in inverted fashion both to an input of the AND gate 21 and to an input of the AND gate 23. The outputs of the two AND gates 21 and 23 are connected via a respective driver amplifier 31 and 32 to the control terminal of the semiconductor element 2. In this case, the driver amplifier 32 supplies a current approximately five times that provided by the driver amplifier 31. This results in a total current, in the case where both driver amplifiers are active, which corresponds to six times the value of the normal current usually provided by the driver amplifier 31 for switching.

Figure 4:
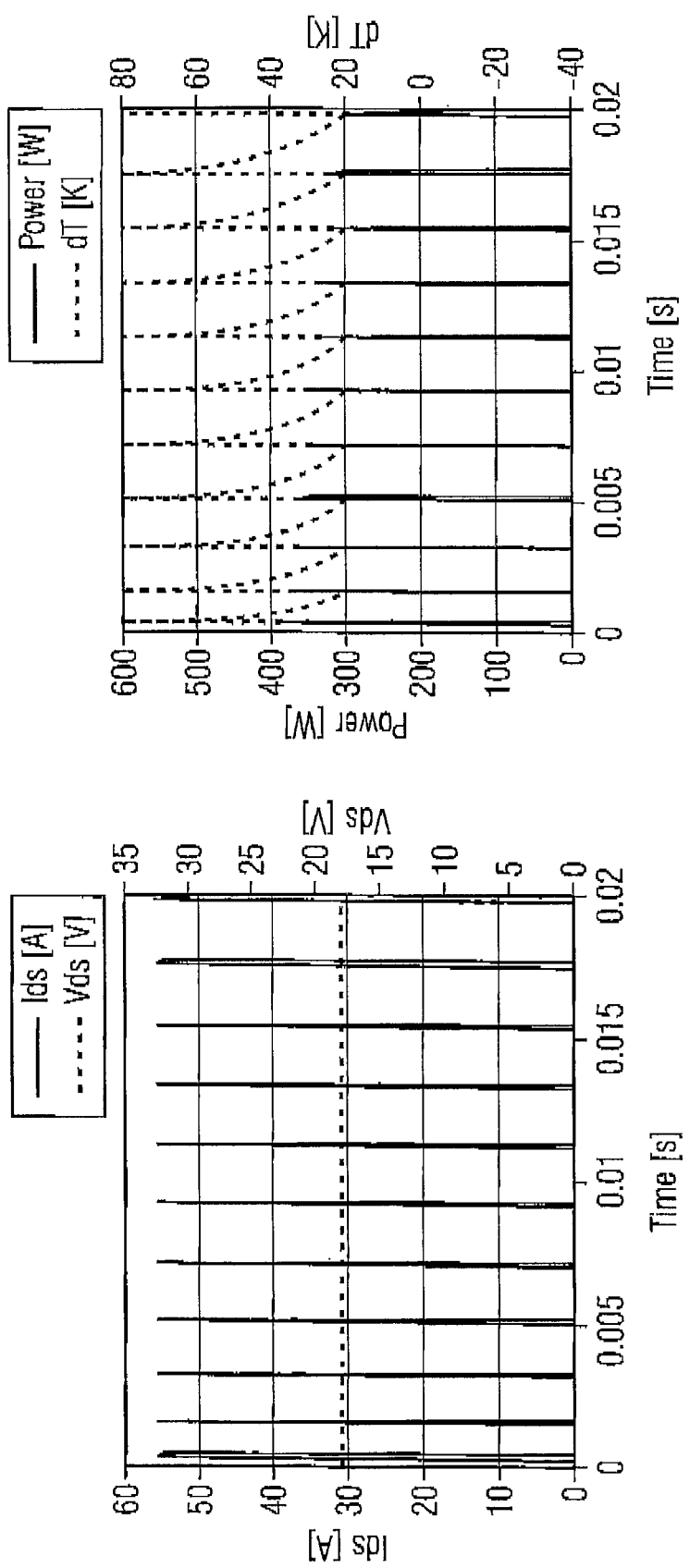
FIG. 4 is a diagram showing switch-on current, switch-on voltage, power consumed and temperature difference against time in conventional power semiconductor switches.
Figure 5:
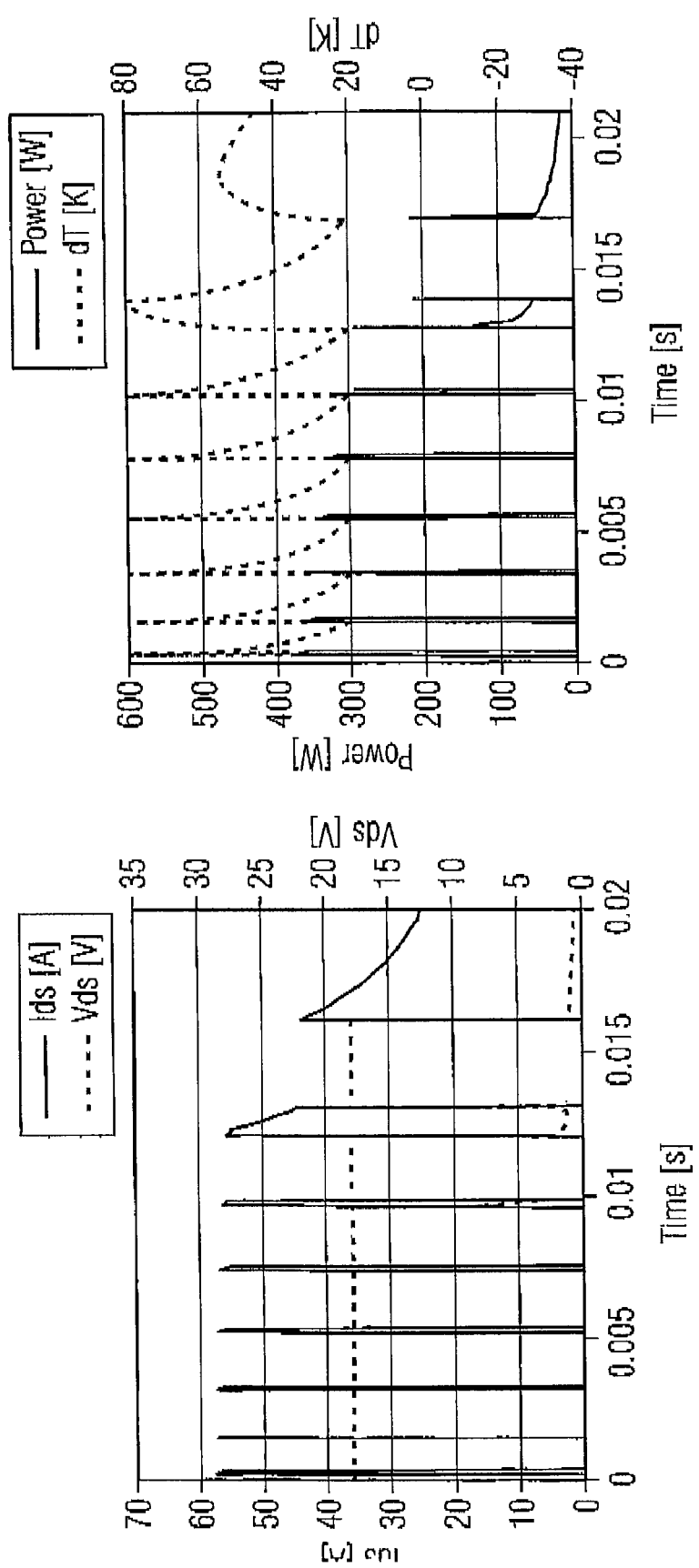
FIG. 5 is a diagram corresponding to FIG. 4 but for a semiconductor switch according to the invention.

FIGS. 4 and 5 compare the behavior of a conventional semiconductor switch (FIG. 4) with that of a semiconductor switch according to the invention (FIG. 5). As can be seen from the graph for the load current Ids at the bottom on the left in FIG. 4, the current rises up to 55 A and thus triggers the overcurrent protection and/or overtemperature protection, which has the effect that the current returns to 0 again, remains there for some time and rises again until it has reached the respective limit value. The voltage Vds across the semiconductor element 2 follows this behavior in that it remains, for example, at just under 18 V as long as the semiconductor switch is switched off, and returns to a value towards zero if the semiconductor switch is switched on. A specific power loss profile corresponds to this, the power loss profile being shown at the bottom on the right in FIG. 4. In this case, the power P increases with the switch-on (semiconductor switch in conducting state) and then, after reaching the relevant limit value, falls again in a manner essentially corresponding to the profile of the current Ids until it reaches its peak value again with the next switch-on, and so on. Difference temperature profiles dT correspondingly form in accordance with FIG. 4 at the top on the right, the profiles having a shallower falling edge in accordance with the cooling down. As can be seen therefrom, in this case it does not happen that the load (an incandescent lamp in this case) remains permanently switched on, as a result of which the full power available cannot be taken up by the load. Accordingly, the switch-on of the load does not occur even within 20 msec.

The corresponding profiles in the case of a semiconductor switch according to the invention are shown in FIG. 5. It can be seen therefrom that, for the same load, the semiconductor switch is in a stable permanently switched-on operating state even after approximately 16 msec. As can be seen in particular therefrom, the spacings between the switch-off instants become continually greater which is also correspondingly manifested in the profiles of the voltages Vds, of the power p-load and of the difference temperature dT. In this case, after 16 msec after the switch-on, a current limiting (or alternatively a switch-off (not shown in this figure)) occurs for the last time and from then on a stable operation occurs.

In this case, the semiconductor switches shown in FIGS. 1 and 3 carry out the method steps presented below. The temperature of the semiconductor element 2 is measured at two measurement locations spaced apart from one another. A signal representing the difference between the two temperatures is generated therefrom. A driving current of specific intensity is driven into the control terminal of the semiconductor element if a corresponding signal is present at the control input of the control circuit in order to control the semiconductor element in the conducting state between its load terminals. In this case, the intensity of the driving current is increased if the semiconductor element is intended to be controlled in the conducting state and the temperature difference exceeds the associated limit value.

Figure 6:
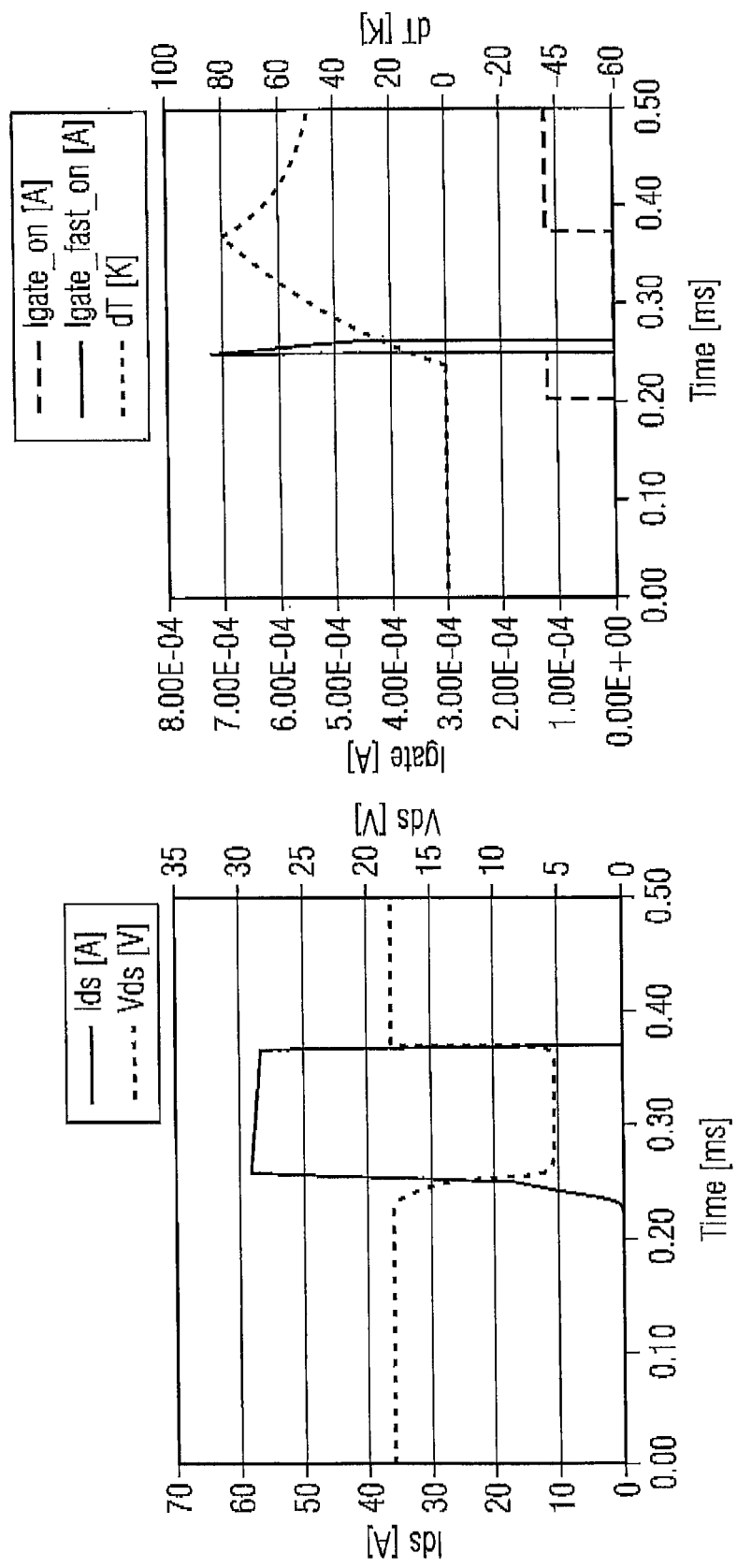
FIG. 6 shows the initial switch-on behavior of a semiconductor switch according to the invention.

FIG. 6 illustrates in detail the first pulse after the occurrence of a switch-on signal at the control contact 13. In this exemplary embodiment, in the case of a temperature difference dT=10 K, the driver current Igate_on is increased by a further driver charging current Igate_fast on until the value of the current limiting is reached. The behavior shown in FIG. 5 essentially corresponds to the behavior of the semiconductor switch shown in FIG. 1.

What is claimed is:

1. A semiconductor switch comprising:
   a semiconductor element, comprising a control terminal and two load terminals that form switching contacts of the semiconductor switch;
   a temperature measuring device, which measures a temperature of the semiconductor element and provides a signal representing the measured temperature; and
   a control circuit, coupled between the temperature measuring device and the control terminal of the semiconductor element, the control circuit having a control input forming a control contact of the semiconductor switch and which, in the event of a corresponding signal at the control input, drives a driving current into the control terminal of the semiconductor element in order to control the semiconductor element in the conducting state between its two load terminals, wherein the control circuit increases the driving current when the semiconductor element is controlled in the conducting state and the signal representing the measured temperature exceeds a first limit value.

2. The semiconductor switch as claimed in claim 1, wherein the control circuit causes the semiconductor element into the non-conducting state when the semiconductor element is controlled in the conducting state and the temperature exceeds a second limit value, wherein the first limit value is lower than the second limit value.

3. The semiconductor switch as claimed in claim 1, wherein the temperature measuring device measures temperatures of the semiconductor element at two measurement locations spaced apart from one another, and provides a signal representing the difference between the two temperatures.

4. The semiconductor switch as claimed in claim 3, wherein the signal representing the difference between the two temperatures is used as the signal representing the measured temperature and is compared with the first limit value.

5. The semiconductor switch as claimed in claim 3, wherein the signal representing the difference between the two temperatures is used in addition to the signal representing the measured temperature and is compared with a third limit value.

6. The semiconductor switch as claimed in claim 1, further comprising:
   a current measuring device coupled to the control circuit, the current measuring device providing a signal representing a load current flowing between the load terminals, and
   wherein the control circuit controls the semiconductor element into a less conducting state or the non-conducting state when the semiconductor element is controlled in the conducting state and the load current exceeds a fourth limit value.

7. The semiconductor switch as claimed in claim 6, wherein the control circuit takes account of the exceeding of the fourth limit value in time-delayed fashion.

8. The semiconductor switch as claimed in claim 3, wherein the semiconductor element includes an active region and an edge region, wherein one measurement location is adjacent the active region and the other measurement location is adjacent the edge region.

9. The semiconductor switch as claimed in claim 1, wherein the control circuit increases the driving current by two- to ten-fold.

10. The semiconductor switch as claimed in claim 1, wherein the semiconductor element comprises a metal oxide field effect transistor.

11. A method of operating a semiconductor switch having a control input and first and second switching terminals, the method comprising:
   measuring a temperature of the semiconductor switch and providing a signal representing the temperature;
   driving a driving current into a control terminal of a switching element of the semiconductor switch in response to a signal present at the control input in order to control the semiconductor switch in the conducting state between the first and second switching terminals; and
   increasing the driving current if the semiconductor switch is in the conducting state and the signal representing the temperature exceeds a first limit value.

12. The method as claimed in claim 11, further comprising causing the semiconductor switch into a non-conducting state, in the case where the semiconductor switch is the conducting state and the temperature exceeds a second limit value, wherein the first limit value is lower than the second limit value.

13. The method as claimed in claim 11, wherein measuring a temperature comprises measuring temperatures of the semiconductor switch at two measurement locations that are spaced apart from one another, wherein a signal representing a temperature difference between the two measurement locations is provided.

14. The method as claimed in claim 13, wherein the signal representing the temperature difference is used as the signal representing the measured temperature.

15. The method as claimed in claim 13, wherein the signal representing the temperature difference is used in addition to the signal representing the measured temperature.

16. The method as claimed in claim 11, further comprising:
providing a signal that represents a load current flowing between the first and second switching terminals; and
causing the semiconductor element into a non-conducting state if the semiconductor element is in the conducting state and the load current exceeds a fourth limit value.

17. The method as claimed in claim 16, wherein exceeding the fourth limit value is taken into account in time-delayed fashion.

18. The method as claimed in claim 13, wherein the semiconductor element has an active region and an edge region, wherein one of the measurement locations is adjacent the active region and the other measurement location is adjacent the edge region.

19. The method as claimed in claim 11, wherein increasing the intensity of the driving current comprises increasing the intensity by two-fold to ten-fold.

20. The method as claimed in claim 11, wherein the semiconductor switch comprises:
the semiconductor element, the semiconductor element having switching contacts that correspond with the switching terminals of the semiconductor switch;
a temperature measuring device for measuring the temperature of the semiconductor switch; and
a control circuit for causing the semiconductor element to be in the conducting state or in a non-conducting state and for causing the driving current to be increased.

* * * * *